United States Patent
Feng et al.

(10) Patent No.: US 11,222,565 B2
(45) Date of Patent: Jan. 11, 2022

(54) SHIFT REGISTER, GATE DRIVING CIRCUIT AND DRIVING METHOD THEREOF, DISPLAY APPARATUS

(71) Applicants: BOE TECHNOLOGY GROUP CO., LTD., Beijing (CN); Hefei Xinsheng Optoelectronics Technology Co., Ltd., Hefei (CN)

(72) Inventors: Xuehuan Feng, Beijing (CN); Xing Zhang, Beijing (CN); Qi Hu, Beijing (CN); Pan Xu, Beijing (CN); Yongqian Li, Beijing (CN); Meng Li, Beijing (CN); Zhidong Yuan, Beijing (CN); Zhenfei Cai, Beijing (CN); Can Yuan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 753 days.

(21) Appl. No.: 16/072,049

(22) PCT Filed: Jan. 8, 2018

(86) PCT No.: PCT/CN2018/071745
§ 371 (c)(1),
(2) Date: Jul. 23, 2018

(87) PCT Pub. No.: WO2018/205666
PCT Pub. Date: Nov. 15, 2018

(65) Prior Publication Data
US 2021/0193001 A1 Jun. 24, 2021

(30) Foreign Application Priority Data
May 11, 2017 (CN) .......................... 201710330074.5

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............. G09G 3/20; G09G 2300/0426; G09G 2310/0267; G09G 2310/0286; G09G 2310/08; G11C 19/28
See application file for complete search history.

(56) References Cited

U.S. PATENT DOCUMENTS 7,145,545 B2 * 12/2006 Zebedee ................ G11C 19/28
345/100
7,460,634 B2 * 12/2008 Deane .................. G09G 3/3677
377/64

(Continued)

FOREIGN PATENT DOCUMENTS

| CN | 1395256 A | 2/2003 |
|---|---|---|
| CN | 101242178 A | 8/2008 |

(Continued)

OTHER PUBLICATIONS

First Office Action dated May 3, 2018 corresponding to Chinese application No. 201710330074.5.

(Continued)

*Primary Examiner* — Sejoon Ahn
(74) *Attorney, Agent, or Firm* — Nath, Goldberg & Meyer; Joshua B. Goldberg

(57) ABSTRACT

The present application discloses a shift register, a gate driving circuit and a driving method thereof, and a display apparatus. The shift register includes an input sub-circuit, an output sub-circuit, a reset control sub-circuit, a pull-up node
(Continued)

reset sub-circuit, and an output signal reset sub-circuit; the input sub-circuit is configured to pre-charge the pull-up node under the control of a signal input to the first signal input terminal; the output sub-circuit is configured to output, through the signal output terminal, a signal input to the first clock signal input terminal under the control of a potential of the pull-up node; the reset control sub-circuit is configured to control, under the control of a reset signal input to the second signal input terminal, whether the pull-up node reset sub-circuit and the output signal reset sub-circuit operate to reset the pull-up node and the signal output terminal, respectively.

20 Claims, 6 Drawing Sheets

(52) U.S. Cl.
CPC ............ *G09G 2310/0267* (2013.01); *G09G 2310/0286* (2013.01); *G09G 2310/08* (2013.01)

(56) References Cited

U.S. PATENT DOCUMENTS

| | | | | |
|---|---|---|---|---|
| 2002/0033676 | A1* | 3/2002 | Harada | G09G 3/30 315/169.1 |
| 2002/0033677 | A1* | 3/2002 | Okada | G09G 3/2927 315/169.1 |
| 2002/0145599 | A1* | 10/2002 | Endo | G09G 3/3622 345/211 |
| 2002/0149318 | A1* | 10/2002 | Jeon | G09G 3/3666 315/169.1 |
| 2008/0056430 | A1 | 3/2008 | Chang et al. | |
| 2009/0278785 | A1 | 11/2009 | Chin-Cheng | |

FOREIGN PATENT DOCUMENTS

| | | |
|---|---|---|
| CN | 103258495 A | 8/2013 |
| CN | 106952604 A | 7/2017 |

OTHER PUBLICATIONS

International Search Report dated Apr. 3, 2018 corresponding to application No. PCT/CN2018/071745.

* cited by examiner in the input phase, pre-charging, by the input sub-circuit, the pull-up node under the control of the signal input to the first signal input terminal; and meanwhile, pulling down, by the pull-down sub-circuit, potentials of the nodes A and B under the control of the signal input to the first signal input terminal, the node A being a node at which the pull-down sub-circuit and the pull-up node reset sub-circuit are connected; and the node B being a node at which the reset control sub-circuit, the pull-down sub-circuit, the pull-up node reset sub-circuit, and the output signal reset sub-circuit are connected

↓ in the output phase, outputting, by the output sub-circuit, the signal input to the first clock signal input terminal through the signal output terminal under the control of the potential of the pull-up node; meanwhile, preventing, by the potential maintaining sub-circuit, the pull-up node reset sub-circuit from generating a leakage current under the control of the signal input to the first clock signal input terminal

↓ in the reset phase, controlling, by the reset control sub-circuit, the pull-up node reset sub-circuit and the output signal reset sub-circuit to operate under the control of the reset signal input to the second signal input terminal such that the pull-up node reset sub-circuit resets the pull-up node under the control of the reset control sub-circuit and the output signal reset sub-circuit resets the signal output terminal under the control of the reset control sub-circuit; meanwhile preventing, by the potential maintaining sub-circuit, the pull-up node reset sub-circuit from generating a leakage current under the control of the signal input to the second clock signal input terminal

FIG. 8

SHIFT REGISTER, GATE DRIVING CIRCUIT AND DRIVING METHOD THEREOF, DISPLAY APPARATUS

CROSS-REFERENCE TO RELATED APPLICATION

This is a National Phase Application filed under 35 U.S.C. 371 as a national stage of PCT/CN2018/071745, filed on Jan. 8, 2018, an application claiming the benefit of priority to Chinese Patent Application No. 201710330074.5 filed on May 11, 2017, the contents of which are incorporated herein in their entirety by reference.

TECHNICAL FIELD

The present disclosure relates to the field of display technology, and particularly relates to a shift register, a gate driving circuit and a driving method thereof, and a display apparatus.

BACKGROUND

At present, with the development of the display field, display panels are required to have lower costs. How to effectively reduce the manufacturing costs of panels is related to competitiveness of panel developers. In order to reduce the manufacturing cost of a display panel, a technician may provide a gate driving circuit in an edge region of the panel. The gate driving circuit includes a plurality of gate shift registers, and in a display phase, each gate shift register controls a corresponding row to display when the row needs to display. The shift registers are coupled, and a shift register transmits an output signal to the next shift register after receiving a signal and completing a shift process, thereby implementing row-by-row scan. This design can not only avoid providing a plurality of gate driving chips in the edge region of the panel, which facilitates implementation of a narrow bezel design of the panel, but also reduce the manufacturing cost of the panel and improve competitiveness of the product.

SUMMARY

According to an aspect of the present disclosure, there is provided a shift register including an input sub-circuit, an output sub-circuit, a reset control sub-circuit, a pull-up node reset sub-circuit, and an output signal reset sub-circuit;

the input sub-circuit is coupled to a first signal input terminal, the pull-up node reset sub-circuit and a pull-up node, and is configured to pre-charge the pull-up node under the control of a signal input to the first signal input terminal;

the output sub-circuit is coupled to a first clock signal input terminal, the pull-up node, the output signal reset sub-circuit and a signal output terminal, and is configured to output, through the signal output terminal, a signal input to the first clock signal input terminal under the control of a potential of the pull-up node;

the reset control sub-circuit is coupled to the pull-up node reset sub-circuit, the output signal reset sub-circuit, and a second signal input terminal, and is configured to control whether the pull-up node reset sub-circuit and the output signal reset sub-circuit operate or not under the control of a reset signal input to the second signal input terminal;

the pull-up node reset sub-circuit is further coupled to the pull-up node, the second signal input terminal, and the output signal reset sub-circuit, and is configured to reset the pull-up node under the control of the reset control sub-circuit;

the output signal reset sub-circuit is coupled to the output sub-circuit, the signal output terminal and a third signal input terminal, and is configured to reset the signal output terminal under the control of the reset control sub-circuit; and the pull-up node is a node at which the input sub-circuit, the output sub-circuit, and the pull-up node reset sub-circuit are connected.

In an embodiment, the shift register further includes: a pull-down sub-circuit coupled to the first signal input terminal, the third signal input terminal, the pull-up node reset sub-circuit, the reset control sub-circuit and the output signal reset sub-circuit and configured to pull down potentials of nodes A and B under the control of the signal input to the first signal input terminal;

the node A is a node at which the pull-down sub-circuit and the pull-up node reset sub-circuit are connected; the node B is a node at which the reset control sub-circuit, the pull-down sub-circuit, the pull-up node reset sub-circuit, and the output signal reset sub-circuit are connected.

In an embodiment, the reset control sub-circuit includes a third transistor, a first electrode of the third transistor is coupled to the second signal input terminal, a second electrode of the third transistor is coupled to the pull-up node reset sub-circuit and the output signal reset sub-circuit, and a control electrode of the third transistor is coupled to the second signal input terminal.

In an embodiment, the input sub-circuit includes a first transistor;

a first electrode of the first transistor is coupled to the first signal input terminal, a second electrode of the first transistor is coupled to the pull-up node reset sub-circuit and the pull-up node, and a control electrode of the first transistor is coupled to the first signal input terminal.

In an embodiment, the output sub-circuit includes a fifth transistor and a storage capacitor;

a first electrode of the fifth transistor is coupled to the first clock signal input terminal, a second electrode of the fifth transistor is coupled to a second terminal of the storage capacitor, the output signal reset sub-circuit and the signal output terminal, and a control electrode of the fifth transistor is coupled to the pull-up node and a first terminal of the storage capacitor.

In an embodiment, the pull-up node reset sub-circuit includes a second transistor and a seventh transistor;

a first electrode of the second transistor is coupled to the input sub-circuit and the pull-up node, a second electrode of the second transistor is coupled to the third signal input terminal, and a control electrode of the second transistor is coupled to a first electrode of the seventh transistor; and a second electrode of the seventh transistor is coupled to the second signal input terminal, and a control electrode of the seventh transistor is coupled to the reset control sub-circuit and the output signal reset sub-circuit.

In an embodiment, the output signal reset sub-circuit includes an eighth transistor;

a first electrode of the eighth transistor is coupled to the output sub-circuit and the signal output terminal, a second electrode of the eighth transistor is coupled to the third signal input terminal, and a control electrode of the eighth transistor is coupled to the pull-up node reset sub-circuit and the reset control sub-circuit.

In an embodiment, the pull-down sub-circuit includes a sixth transistor and a fourth transistor;

a first electrode of the sixth transistor is coupled to the pull-up node reset sub-circuit, a second electrode of the sixth transistor is coupled to the third signal input terminal, and a control electrode of the sixth transistor is coupled to the first signal input terminal; and a first electrode of the fourth transistor is coupled to the pull-up node reset sub-circuit, the reset control sub-circuit, and the output signal reset sub-circuit, a second electrode of the fourth transistor is coupled to the third signal input terminal, and a control electrode of the fourth transistor is coupled to the first signal input terminal.

In an embodiment, the shift register further includes: a potential maintaining sub-circuit coupled to a second clock signal input terminal, the first signal input terminal, the input sub-circuit, the first clock signal input terminal and the pull-up node reset sub-circuit and configured to prevent the pull-up node reset sub-circuit from generating a leakage current under the control of signals input to the first clock signal input terminal and the second clock signal input terminal.

In an embodiment, the potential maintaining sub-circuit includes a ninth transistor and a tenth transistor;

a first electrode of the ninth transistor is coupled to the first signal input terminal and the input sub-circuit, a second electrode of the ninth transistor is coupled to the input sub-circuit, the pull-up node reset sub-circuit and a first electrode of the tenth transistor, and a control electrode of the ninth transistor is coupled to the second clock signal input terminal; and a second electrode of the tenth transistor is coupled to the first clock signal input terminal, the output sub-circuit and a control electrode of the tenth transistor, and the control electrode of the tenth transistor is further coupled to the first clock signal input terminal and the output sub-circuit.

In an embodiment, the input sub-circuit includes a first transistor; a first electrode of the first transistor is coupled to the potential maintaining sub-circuit, a second electrode of the first transistor is coupled to the pull-up node and the pull-up node reset sub-circuit, and a control electrode of the first transistor is coupled to the first signal input terminal.

In an embodiment, the pull-up node reset sub-circuit includes a second transistor and a seventh transistor;

a first electrode of the second transistor is coupled to the input sub-circuit and the pull-up node, a second electrode of the second transistor is coupled to the potential maintaining sub-circuit, and a control electrode of the second transistor is coupled to a first electrode of the seventh transistor; and a second electrode of the seventh transistor is coupled to the second signal input terminal, and a control electrode of the seventh transistor is coupled to the reset control sub-circuit and the output signal reset sub-circuit.

In another aspect, the present disclosure further provides a gate driving circuit including a plurality of cascaded shift registers each being any one of the above shift registers, wherein the signal output terminal of the N-th shift register is coupled to the first signal input terminal of the (N+1)-th shift register; and the second signal input terminal of the N-th shift register is coupled to the signal output terminal of the (N+2)-th shift register.

In another aspect, the present disclosure also provides a display apparatus including the above gate driving circuit.

In another aspect, the present disclosure further provides a driving method of a gate driving circuit, the gate driving circuit including a plurality of cascaded shift registers each being any one of the above shift registers, and the driving method includes:

in an input phase, pre-charging, by the input sub-circuit, the pull-up node under the control of the signal input to the first signal input terminal;

in an output phase, outputting, by the output sub-circuit, the signal input to the first clock signal input terminal through the signal output terminal under the control of a potential of the pull-up node;

in a reset phase, controlling, by the reset control sub-circuit, the pull-up node reset sub-circuit and the output signal reset sub-circuit to operate under the control of the reset signal input to the second signal input terminal, such that the pull-up node reset sub-circuit resets the pull-up node under the control of the reset control sub-circuit and the output signal reset sub-circuit resets the signal output terminal under the control of the reset control sub-circuit.

In an embodiment, the driving method of a gate driving circuit further includes:

in the input phase, pulling down, by the pull-down sub-circuit, potentials of nodes A and B under the control of the signal input to the first signal input terminal; wherein the node A is a node at which the pull-down sub-circuit and the pull-up node reset sub-circuit are connected; the node B is a node at which the reset control sub-circuit, the pull-down sub-circuit, the pull-up node reset sub-circuit, and the output signal reset sub-circuit are connected.

The shift register further includes: a potential maintaining sub-circuit coupled to a second clock signal input terminal, the first signal input terminal, the input sub-circuit, the first clock signal input terminal, and the pull-up node reset sub-circuit, and configured to prevent the pull-up node reset sub-circuit from generating a leakage current under the control of signals input to the first clock signal input terminal and the second clock signal input terminal, and the driving method further includes:

in the output phase, preventing, by the potential maintaining sub-circuit, the pull-up node reset sub-circuit from generating a leakage current under the control of the signal input to the first clock signal input terminal; and in the reset phase, preventing, by the potential maintaining sub-circuit, the pull-up node reset sub-circuit from generating a leakage current under the control of the signal input to the second clock signal input terminal.

In an embodiment, the driving method further includes:

in the input phase, inputting a signal at a first level to the first signal input terminal such that the input sub-circuit pre-charges the pull-up node;

in the output phase, inputting a signal at a second level to the first signal input terminal and inputting a first clock signal to the first clock signal input terminal such that the output sub-circuit outputs, under the control of the potential of the pull-up node, the first clock signal input to the first clock signal input terminal through the signal output terminal, wherein the signal at the first level input to the first signal input terminal in the input phase and the signal at the second level input to the first signal input terminal in the output phase are logically opposite signals; and in the reset phase, inputting a reset signal to the second signal input terminal such that the reset control sub-circuit controls the pull-up node reset sub-circuit and the output signal reset sub-circuit to operate, so that the pull-up node reset sub-circuit resets the pull-up node under the control of the reset control sub-circuit and the output signal reset sub-circuit resets the signal output terminal under the control of the reset control sub-circuit.

In an embodiment, the driving method further includes:

in the input phase, inputting a signal at a first level to the first signal input terminal such that the input sub-circuit pre-charges the pull-up node;

in the output phase, inputting a signal at a second level to the first signal input terminal and inputting a first clock signal to the first clock signal input terminal, such that the output sub-circuit outputs, under the control of the potential of the pull-up node, the first clock signal input to the first clock signal input terminal through the signal output terminal, and the potential maintaining sub-circuit prevents, under the control of the first clock signal input to the first clock signal input terminal, the pull-up node reset sub-circuit from generating a leakage current, wherein the signal at the first level input to the first signal input terminal in the input phase and the signal at the second level input to the first signal input terminal in the output phase are logically opposite signals; and in the reset phase, inputting a reset signal to the second signal input terminal and inputting a second clock signal to the second clock signal input terminal such that the reset control sub-circuit controls the pull-up node reset sub-circuit and the output signal reset sub-circuit to operate, so that the pull-up node reset sub-circuit resets the pull-up node under the control of the reset control sub-circuit, the output signal reset sub-circuit resets the signal output terminal under the control of the reset control sub-circuit, and the potential maintaining sub-circuit prevents the pull-up node reset sub-circuit from generating a leakage current under the control of the second clock signal input to the second clock signal input terminal.

In an embodiment, the first clock signal input terminal and the second clock signal input terminal are applied with logically opposite clock signals.

In the shift register, the gate driving circuit and the driving method thereof, and the display apparatus of the present disclosure, the shift register includes: an input sub-circuit, an output sub-circuit, a reset control sub-circuit, a pull-up node reset sub-circuit, and an output signal reset sub-circuit, the reset control sub-circuit can control on and off states of the pull-up node reset sub-circuit under the control of the reset signal input to the second signal input terminal, so that the pull-up node reset sub-circuit can be prevented from being turned on in the input phase, which in turn avoids noise at the second signal input terminal; at the same time, the shift register of the present disclosure is provided with only one DC signal, i.e., a DC low-level signal, which reduces complexity of the circuit structure.

BRIEF DESCRIPTION OF THE DRAWINGS

FIG. 8 is a flow chart illustrating a driving method of a gate driving circuit according to an embodiment of the present disclosure.

DETAILED DESCRIPTION

To enable those skilled in the art to better understand technical solutions of the present disclosure, the present disclosure will be further described in detail below in conjunction with the accompanying drawings and specific embodiments.

The inventor of the present application found that the problems encountered during the design of the gate driving circuit in a conventional display panel are mainly concentrated in a signal input phase. In the signal input phase, a reset signal may interfere with an input signal. In particular, oxide thin film transistors (TFTs) are often used in OLED display panels, however, the oxide TFTs are usually depleted and often in a conducting state when being floating, and an external impurity signal or an output signal from the next stage may be written thereto. In addition, an existing shift register generally requires two DC signals, i.e., a DC high level signal and a DC low level signal, and has a relatively complicated circuit structure.

A transistor adopted in embodiments of the present disclosure may be a thin film transistor or a field effect transistor, or other device having similar characteristics. Since the source electrode and the drain electrode of the adopted transistor are symmetrical, the source electrode and the drain electrode make no difference. In the embodiment of the present disclosure, in order to distinguish the source electrode from the drain electrode of the transistor, one of the source and drain electrodes is referred to as a first electrode, the other of the source and drain electrodes is referred to as a second electrode, and the gate electrode is referred to as a control electrode. In addition, transistors can be classified into N-type transistors and P-type transistors according to their characteristics, and the following embodiments are described by taking N-type transistors as an example. In a case of an N-type transistor, the first electrode refers to the source electrode of the N-type transistor, the second electrode refers to the drain electrode of the N-type transistor, and when the gate electrode is applied with a high level, the source electrode and drain electrode are conducting, and for a P-type transistor, the opposite is the case. It could be understood that the implementation of the present application by using a P-type transistor can be easily conceived by those skilled in the art without any creative effort, and therefore, is also within the protection scope of the embodiments of the present disclosure.

Figure 1:
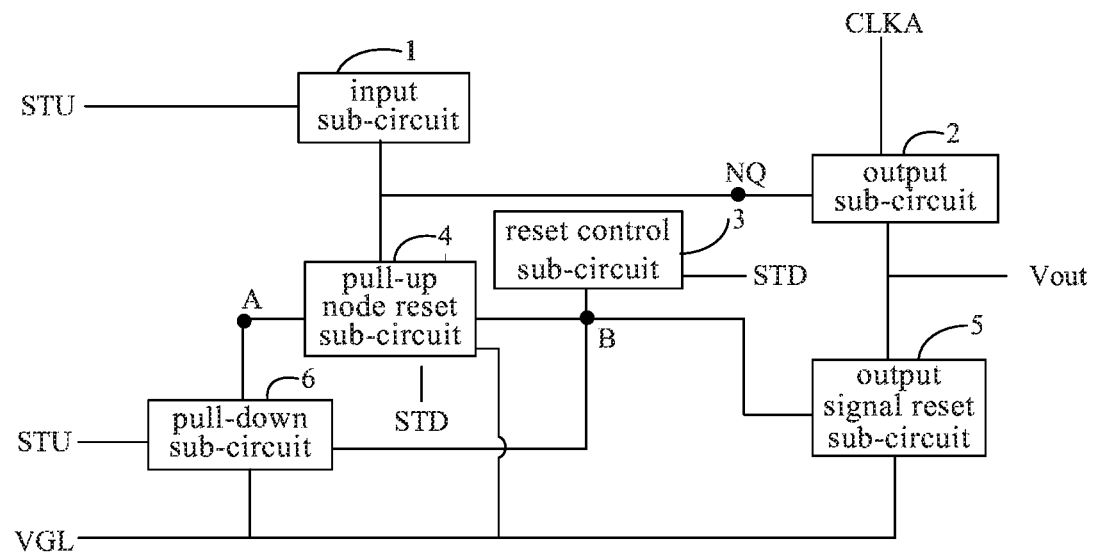
FIG. 1 is a block diagram of a structure of a shift register according to an embodiment of the present disclosure.
Figure 2:
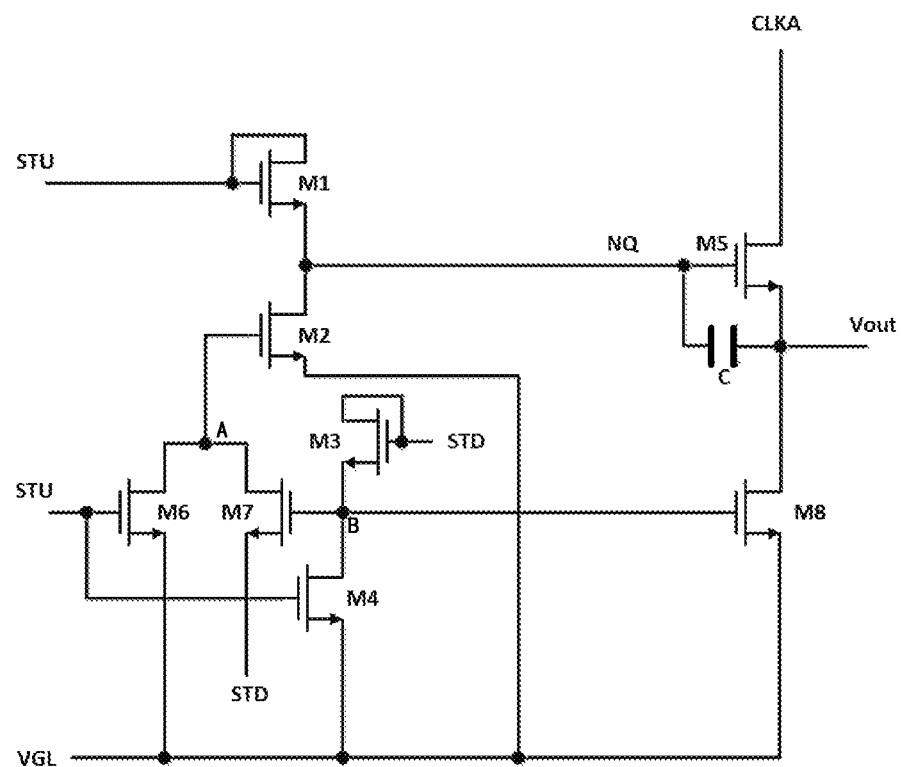
FIG. 2 is a circuit diagram of a shift register according to an embodiment of the present disclosure.
Figure 3:
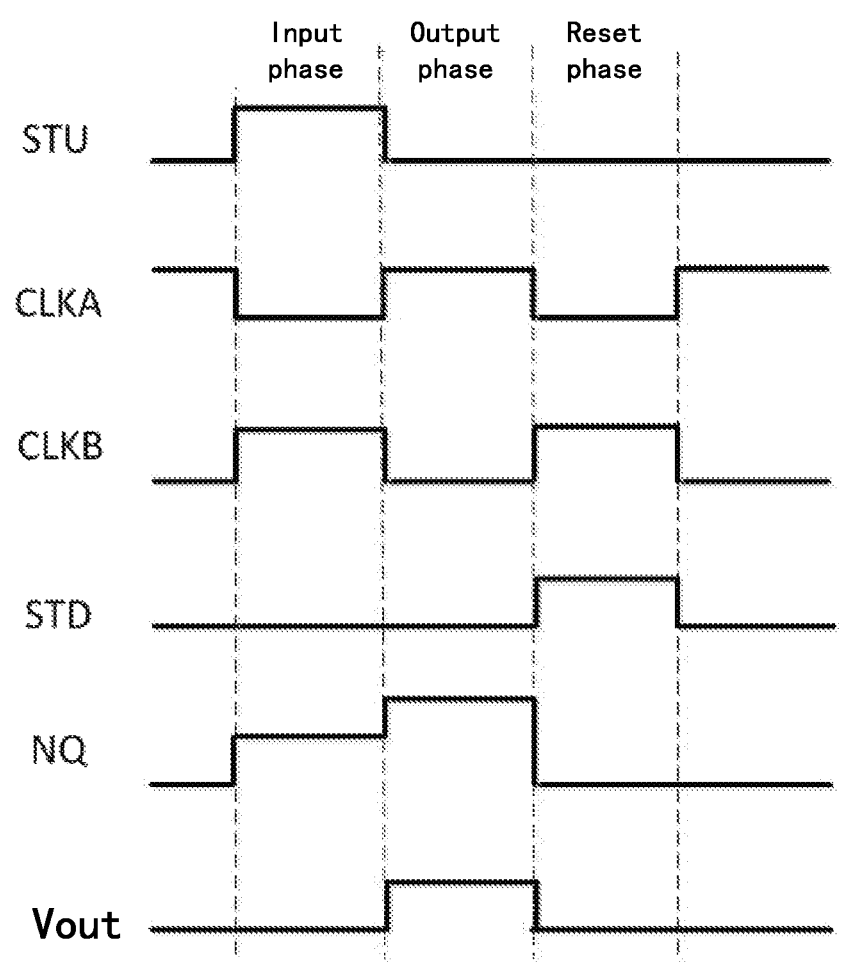
FIG. 3 is a timing diagram illustrating operation of a shift register according to an embodiment of the present disclosure.
Figure 4:
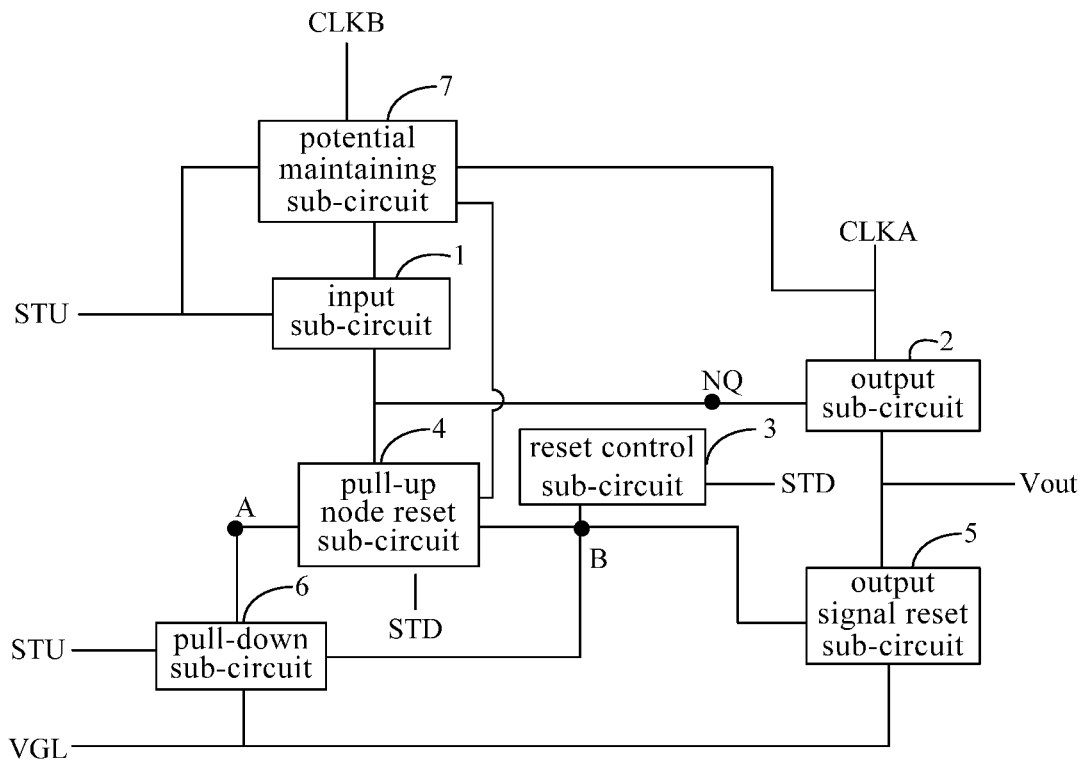
FIG. 4 is a block diagram of a structure of a shift register according to an embodiment of the present disclosure.

In an aspect, referring to FIGS. 1 to 3, the present disclosure provides a shift register including: an input sub-circuit 1, an output sub-circuit 2, a reset control sub-circuit 3, a pull-up node reset sub-circuit 4, and an output signal reset sub-circuit 5.

The input sub-circuit 1 is coupled to a first signal input terminal STU, the pull-up node reset sub-circuit 4 and a pull-up node NQ and configured to pre-charge the pull-up node NQ under the control of a signal input to the first signal input terminal STU.

The output sub-circuit 2 is coupled to a first clock signal input terminal CLKA, the pull-up node NQ, the output signal reset sub-circuit 5 and a signal output terminal Vout and configured to output a signal input to the first clock signal input terminal CLKA through the signal output terminal Vout under the control of a potential of the pull-up node NQ.

The reset control sub-circuit 3 is coupled to the pull-up node reset sub-circuit 4, the output signal reset sub-circuit 5 and a second signal input terminal STD and configured to control whether the pull-up node reset sub-circuit 4 and the output signal reset sub-circuit 5 operate or not under the control of a reset signal input to the second signal input terminal STD.

The pull-up node reset sub-circuit 4 is further coupled to the pull-up node NQ, the second signal input terminal STD, and the output signal reset sub-circuit 5, and configured to reset the pull-up node NQ under the control of the reset control sub-circuit 3.

The output signal reset sub-circuit 5 is further coupled to the output sub-circuit 2, the signal output terminal Vout and a third signal input terminal VGL and configured to reset the signal output terminal Vout under the control of the reset control sub-circuit 3. A signal input to the third signal input terminal VGL is a DC low level signal.

The pull-up node NQ is a node at which the input sub-circuit 1, the output sub-circuit 2, and the pull-up node reset sub-circuit 4 are connected.

As can be seen from FIG. 1, the input sub-circuit 1, the output sub-circuit 2, and the pull-up node reset sub-circuit 4 are all coupled to the pull-up node NQ. In an input phase, the second signal input terminal STD inputs a non-operating level to the reset control sub-circuit 3 so that the reset control sub-circuit 3 and the pull-up node reset sub-circuit 4 are in off state, thus the pull-up node reset sub-circuit 4 is prevented from being turned on during the input phase, thereby preventing the low level input to the third signal input terminal VGL from causing interference to the potential of the pull-up node NQ through the pull-up node reset sub-circuit 4; meanwhile, the shift register in the embodiment is provided with only one DC low level signal input terminal (i.e., the third signal input terminal VGL), thereby reducing the complexity of the shift register.

Referring to FIG. 1, the shift register further includes: a pull-down sub-circuit 6. The pull-down sub-circuit 6 is coupled to the first signal input terminal STU, the third signal input terminal VGL, the pull-up node reset sub-circuit 4, the reset control sub-circuit 3, and the output signal reset sub-circuit 5, and is configured to pull down potentials of node A and node B under the control of a signal input to the first signal input terminal STU. The node A is a node at which the pull-down sub-circuit 6 and the pull-up node reset sub-circuit 4 are connected; the node B is a node at which the reset control sub-circuit 3, the pull-down sub-circuit 6, the pull-up node reset sub-circuit 4, and the output signal reset sub-circuit 5 are connected.

As can be seen from FIG. 1, the pull-down sub-circuit 6 and the pull-up node reset sub-circuit 4 are both coupled to the node A, and the reset control sub-circuit 3, the pull-down sub-circuit 6, the pull-up node reset sub-circuit 4, and the output signal reset sub-circuit 5 are all coupled to the node B. In the input phase, the first signal input terminal STU inputs an operating level to the pull-down sub-circuit 6 to turn on the pull-down sub-circuit 6, so that the low level at the third signal input terminal VGL is input to the node A and the node B, that is, the potential of the node A is pulled down to prevent the pull-up node reset sub-circuit 4 from being turned on, thereby preventing the low level input to the third signal input terminal VGL from causing interference to the potential of the pull-up node NQ through the pull-up node reset sub-circuit 4, and in the meanwhile, the potential of the node B is pulled down to prevent the pull-up node reset sub-circuit 4 and the output signal reset sub-circuit 5 from being turned on, thereby preventing the low level input to the third signal input terminal VGL from causing interference to the potential output by the signal output terminal Vout through the output signal reset sub-circuit 5.

Referring to FIG. 2, the reset control sub-circuit 3 may include a third transistor M3 having a first electrode coupled to the second signal input terminal STD, a second electrode coupled to the pull-up node reset sub-circuit 4 and the output signal reset sub-circuit 5, and a control electrode coupled to the second signal input terminal STD.

The input sub-circuit 1 may include a first transistor M1. A first electrode of the first transistor M1 is coupled to the first signal input terminal STU, a second electrode of the first transistor M1 is coupled to the pull-up node reset sub-circuit 4 and the pull-up node NQ, and a control electrode of the first transistor M1 is coupled to the first signal input terminal STU.

The output sub-circuit 2 may include a fifth transistor M5 and a storage capacitor C. A first electrode of the fifth transistor M5 is coupled to the first clock signal input terminal CLKA, a second electrode of the fifth transistor M5 is coupled to a second terminal of the storage capacitor C, the output signal reset sub-circuit 5 and the signal output terminal Vout, and a control electrode of the fifth transistor M5 is coupled to a first terminal of the storage capacitor C and the pull-up node NQ.

The pull-up node reset sub-circuit 4 may include a second transistor M2 and a seventh transistor M7. A first electrode of the second transistor M2 is coupled to the input sub-circuit 1 and the pull-up node NQ, a second electrode of the second transistor M2 is coupled to the third signal input terminal VGL, and a control electrode of the second transistor M2 is coupled to a first electrode of the seventh transistor M7. A second electrode of the seventh transistor M7 is coupled to the second signal input terminal STD, and a control electrode of the seventh transistor M7 is coupled to the reset control sub-circuit 3 and the output signal reset sub-circuit 5. As shown in FIG. 2, the first electrode of the second transistor M2 is coupled to the second electrode of the first transistor M1 in the input sub-circuit 1. The control electrode of the seventh transistor M7 is coupled to the second electrode of the third transistor M3 in the reset control sub-circuit 3.

The output signal reset sub-circuit 5 may include an eighth transistor M8. A first electrode of the eighth transistor M8 is coupled to the output sub-circuit 2 and the signal output terminal Vout, a second electrode of the eighth transistor M8 is coupled to the third signal input terminal VGL, and a control electrode of the eighth transistor M8 is coupled to the pull-up node reset sub-circuit 4 and the reset control sub-circuit 3. As shown in FIG. 2, the first electrode of the eighth transistor M8 is coupled to the second electrode of the fifth transistor M5 in the output sub-circuit 2, and the control electrode of the eighth transistor M8 is coupled to the control electrode of the seventh transistor M7 in the pull-up node reset sub-circuit 4 and the second electrode of the third transistor M3 in the reset control sub-circuit 3.

The pull-down sub-circuit 6 may include a sixth transistor M6 and a fourth transistor M4. A first electrode of the sixth transistor M6 is coupled to the pull-up node reset sub-circuit 4, a second electrode of the sixth transistor M6 is coupled to the third signal input terminal VGL, and a control electrode of the sixth transistor M6 is coupled to the first signal input terminal STU. A first electrode of the fourth transistor M4 is coupled to the pull-up node reset sub-circuit 4, the reset control sub-circuit 3 and the output signal reset sub-circuit 5, a second electrode of the fourth transistor M4 is coupled to the third signal input terminal VGL, and a control electrode of the fourth transistor M4 is coupled to the first signal input terminal STU. As shown in FIG. 2, the first electrode of the sixth transistor M6 is coupled to the node A, i.e., to the control electrode of the second transistor M2 and the first electrode of the seventh transistor M7 in the pull-up node reset sub-circuit 4. The first electrode of the fourth transistor M4 is coupled to the node B, i.e., to the control electrode of the seventh transistor M7 in the pull-up node reset sub-circuit 4, the second electrode of the third transistor M3 in the reset control sub-circuit 3, and the control electrode of the eighth transistor M8 in the output signal reset sub-circuit 5.

The operating principle of the shift register of the present embodiment in an input phase, an output phase, and a reset phase will be described below with reference to the timing diagram shown in FIG. 3.

Input Phase:

(1) The first signal input terminal STU is supplied with a high level, the first transistor M1 is turned on, so that a potential of the pull-up node NQ is raised to a high level, and at the same time, the storage capacitor C is charged; since the potential of the pull-up node NQ rises to a high level, the fifth transistor M5 is turned on, and at this point, the first clock signal (at a low level) input to the first clock signal input terminal CLKA is output from the signal output terminal Vout.

(2) The first signal input terminal STU is supplied with a high level, the sixth transistor M6 is turned on, and the potential of the node A is pulled down to a low level by the low level input to the third signal input terminal VGL through the sixth transistor M6, so that the second transistor M2 is turned off, thereby preventing the low level input to the third signal input terminal VGL from affecting the potential of the pull-up node NQ.

(3) The first signal input terminal STU is supplied with a high level, the fourth transistor M4 is turned on, and the potential of the node B is pulled down to a low level by the low level input to the third signal input terminal VGL through the fourth transistor M4, so that the seventh transistor M7 and the eighth transistor M8 are turned off, thereby preventing the low level input to the third signal input terminal VGL from interfering with the potential output from the signal output terminal Vout through the eighth transistor M8.

It should be noted that the above sub-steps (1) to (3) in the input phase occur simultaneously, but not in sequence.

Output Phase:

The first signal input terminal STU is supplied with a low level, the first transistor M1 is turned off; since the pull-up node NQ remains at a high level, the fifth transistor M5 is turned on; the potential of the pull-up node NQ continues rising due to the bootstrap effect of the storage capacitor C, and the high level input to the first clock signal input terminal CLKA is output from the signal output terminal Vout through the fifth transistor M5.

Reset Phase:

The second signal input terminal STD is supplied with a high level, the third transistor M3 is turned on, so that the potential of the node B is at a high level, thus the seventh transistor M7 is turned on, and the second signal input terminal STD inputs a high level to the node A through the seventh transistor M7 to thus turn on the second transistor M2; the third signal input terminal VGL inputs a low level to the pull-up node NQ through the second transistor M2, i.e., resets the potential of the pull-up node NQ, to turn off the fifth transistor M5; the node B is at a high level, so that the eighth transistor M8 is turned on, and the third signal input terminal VGL outputs a low level to the signal output terminal Vout through the eighth transistor M8, i.e., rests the potential of the signal output terminal Vout.

The shift register of the embodiment includes: an input sub-circuit 1, an output sub-circuit 2, a reset control sub-circuit 3, a pull-up node reset sub-circuit 4, and an output signal reset sub-circuit 5, the reset control sub-circuit 3 can control on and off states of the pull-up node reset sub-circuit 4 under the control of a reset signal input to the second signal input terminal STD to prevent the pull-up node reset sub-circuit 4 from being turned on in the input phase, thereby avoiding noise at the second signal input terminal STD. At the same time, the shift register of the embodiment is provided with only one DC signal, that is, a DC low level signal (VGL), which reduces the complexity of the circuit structure.

In some embodiments, the shift register further includes: a potential maintaining sub-circuit 7. The potential maintaining sub-circuit 7 is coupled to a second clock signal input terminal CLKB, the first signal input terminal STU, the input sub-circuit 1, the first clock signal input terminal CLKA, and the pull-up node reset sub-circuit 4, and is configured to prevent the pull-up node reset sub-circuit 4 from generating a leakage current under the control of the signals input to the first clock signal input terminal CLKA and the second clock signal input terminal CLKB.

It should be noted that the first and second clock signal input terminals CLKA and CLKB are supplied with logically opposite clock signals, that is, when the first clock signal input terminal CLKA is supplied with a high level, the second clock signal input terminal CLKB is supplied with a low level; when the first clock signal input terminal CLKA is supplied with a low level, the second clock signal input terminal CLKB is supplied with a high level. The first and second clock signal input terminals CLKA and CLKB can be externally controlled.

In the output phase, the first clock signal input terminal CLKA inputs an operating level (e.g., a high level) to the potential maintaining sub-circuit 7 to turn on the potential maintaining sub-circuit 7, so that a potential at a terminal of the pull-up node reset sub-circuit 4 away from the pull-up node NQ (i.e., at the electrode which is not directly coupled to the pull-up node NQ) rises to a high level; because the pull-up node NQ is also at a high level, a voltage difference between the two electrodes of the pull-up node reset sub-circuit 4 is small, thereby avoiding a leakage current generated by the pull-up node reset sub-circuit 4. In the reset phase, the second clock signal input terminal CLKB inputs an operating level (e.g., a high level) to the potential maintaining sub-circuit 7 to turn on the potential maintaining sub-circuit 7, so that the first signal input terminal STU pulls down the potential at a terminal of the pull-up node reset sub-circuit 4 away from the pull-up node NQ to a low level through the potential maintaining sub-circuit 7; because the pull-up node NQ is also at a low level, the voltage difference between the two electrodes of the pull-up node reset sub-circuit 4 is small, thereby avoiding a leakage current generated by the pull-up node reset sub-circuit 4. That is to say, in the output phase and the reset phase, the potential maintaining sub-circuit 7 can reduce the voltage difference between the two electrodes of the pull-up node reset sub-circuit 4, thereby preventing the pull-up node reset sub-circuit 4 from generating a leakage current.

Figure 5:
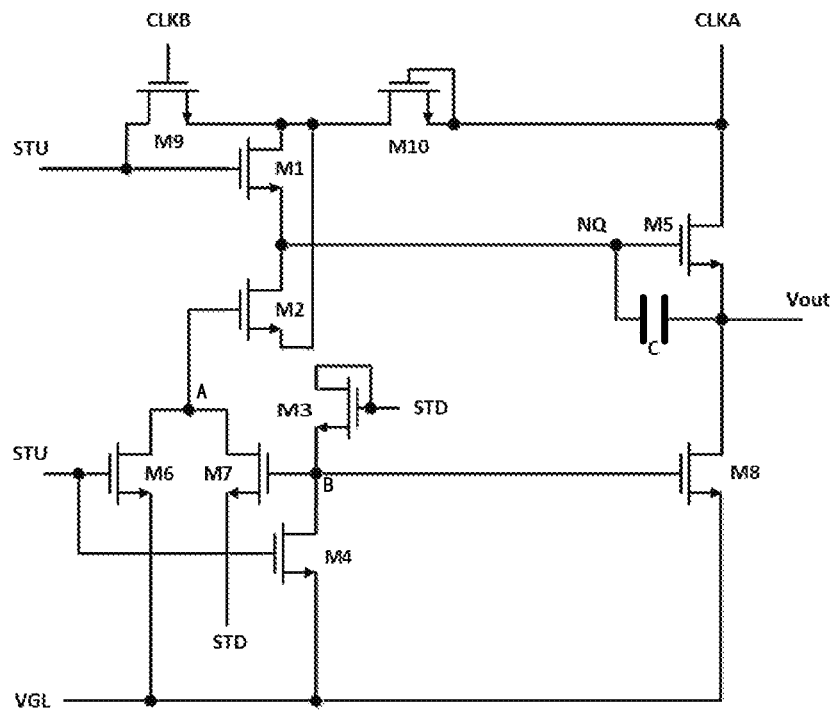
FIG. 5 is a circuit diagram of a shift register according to an embodiment of the present disclosure.

Referring to FIG. 5, the potential maintaining sub-circuit 7 may include a ninth transistor M9 and a tenth transistor M10. A first electrode of the ninth transistor M9 is coupled to the first signal input terminal STU and the input sub-circuit 1 (e.g., the control electrode of the first transistor M1), a second electrode of the ninth transistor M9 is coupled to the input sub-circuit 1 (e.g., the first electrode of the first transistor MD, the pull-up node reset sub-circuit 4 (e.g., the second electrode of the second transistor M2), and a first electrode of the tenth transistor M10, and a control electrode of the ninth transistor M9 is coupled to the second clock signal input terminal CLKB. A second electrode of the tenth transistor M10 is coupled to the first clock signal input terminal CLKA, the output sub-circuit 2 (e.g., the first electrode of the fifth transistor M5) and a control electrode of the tenth transistor M10, and the control electrode of the tenth transistor M10 is further coupled to the first clock signal input terminal CLKA and the output sub-circuit 2 (e.g., the first electrode of the fifth transistor M5).

In this case, the input sub-circuit 1 includes the first transistor M1. The first electrode of the first transistor M1 is coupled to the potential maintaining sub-circuit 7, the second electrode of the first transistor M1 is coupled to the pull-up node NQ and the pull-up node reset sub-circuit 4, and the control electrode of the first transistor M1 is coupled to the first signal input terminal STU.

The pull-up node reset sub-circuit 4 includes a second transistor M2 and a seventh transistor M7. The first electrode of the second transistor M2 is coupled to the input sub-circuit 1 and the pull-up node NQ, the second electrode of the second transistor M2 is coupled to the potential maintaining sub-circuit 7, and the control electrode of the second transistor M2 is coupled to the first electrode of the seventh transistor M7. The second electrode of the seventh transistor M7 is coupled to the second signal input terminal STD, and the control electrode of the seventh transistor M7 is coupled to the reset control sub-circuit 3 and the output signal reset sub-circuit 5.

It should be noted that, in this embodiment, only the connection of the input sub-circuit 1 and the pull-up node reset sub-circuit 4 changes, and the specific connection of the other sub-circuits remains unchanged, as compared with the connection in the foregoing embodiment, and is not repeatedly described herein.

Specifically, the operating principle of the shift register of the present embodiment in the input phase, the output phase, and the reset phase will be described below with reference to the timing diagram shown in FIG. 3.

Input Phase:

(1) The first signal input terminal STU is applied with a high level, and the first transistor M1 is turned on; the second clock signal input terminal CLKB is applied with a high level, and the ninth transistor M9 is turned on; the first signal input terminal STU inputs a high level to the pull-up node NQ through the ninth transistor M9, and charges the storage capacitor C at the same time; the pull-up node NQ is at a high level, so that the fifth transistor M5 is turned on, and at this time, the first clock signal (a low level signal) input to the first clock signal input terminal CLKA is output from the signal output terminal Vout.

(2) The first signal input terminal STU is supplied with a high level, the sixth transistor M6 is turned on, and the third signal input terminal VGL pulls down the potential of the node A to a low level through the sixth transistor M6, so that the second transistor M2 is turned off, thereby preventing the low level input to the third signal input terminal VGL from affecting the potential of the pull-up node NQ.

(3) The first signal input terminal STU is applied with a high level, the fourth transistor M4 is turned on, and the third signal input terminal VGL pulls down the potential of the node B to a low level through the fourth transistor M4, so that the seventh transistor M7 and the eighth transistor M8 are turned off, thereby preventing the low level input to the third signal input terminal VGL from interfering with the potential output from the signal output terminal Vout through the eighth transistor M8.

Output Phase:

(1) The first signal input terminal STU is supplied with a low level, and the first transistor M1 is turned off; since the pull-up node NQ remains at a high level, the fifth transistor M5 is turned on; the potential of the pull-up node NQ continues rising due to the bootstrap effect of the storage capacitor C, and the high level input to the first clock signal input terminal CLKA is output from the signal output terminal Vout through the fifth transistor M5.

(2) The first clock signal input terminal CLKA is supplied with a high level, the tenth transistor M10 is turned on, the first clock signal input terminal CLKA pulls up the potential of one electrode of the second transistor M2 away from the pull-up node NQ to a high level through the tenth transistor M10; since the pull-up node NQ is also at a high level, the voltage difference between the source electrode and the drain electrode of the second transistor M2 is reduced, thereby preventing the second transistor M2 from generating a leakage current.

Reset Phase:

(1) The second signal input terminal STD is supplied with a high level, the third transistor M3 is turned on, so that the node B is at a high level, accordingly, the seventh transistor M7 is turned on, and the second signal input terminal STD inputs a high level to the node A through the seventh transistor M7 to thus turn on the second transistor M2; the third signal input terminal VGL inputs a low level to the pull-up node NQ through the second transistor M2, i.e., resets the potential of the pull-up node NQ, so as to turn off the fifth transistor M5; the node B is at a high level, so that the eighth transistor M8 is turned on, and the third signal input terminal VGL outputs a low level to the signal output terminal Vout through the eighth transistor M8, i.e., resets the potential of the signal output terminal Vout.

(2) The second clock signal input terminal CLKB is applied with a high level, the ninth transistor M9 is turned on, and the first signal input terminal STU pulls down the potential of the electrode of the second transistor M2 away from the pull-up node NQ to a low level through the ninth transistor M9; since the pull-up node NQ is also at a low level, the voltage difference between the source and drain electrodes of the second transistor M2 is decreased, thereby preventing the second transistor M2 from generating a leakage current.

It should be noted that the sub-steps in each phase, such as sub-steps (1) to (3) in the input phase, sub-steps (1) to (2) in the output phase, and sub-steps (1) to (2) in the reset phase, occur at the same time, but not in sequence, which is not repeatedly described herein.

In the shift register of this embodiment, the reset control sub-circuit 3 can control on and off states of the pull-up node reset sub-circuit 4 under the control of the reset signal input to the second signal input terminal STD, so the pull-up node reset sub-circuit 4 can be prevented from being turned on in the input phase, thereby avoiding noise at the second signal input terminal STD; at the same time, the shift register of the embodiment is provided with only one DC signal, i.e., the DC low level signal VGL, which reduces the complexity of the circuit structure; in addition, the potential maintaining sub-circuit 7 can effectively prevent the pull-up node reset sub-circuit 4 from generating a leakage current.

Figure 6:
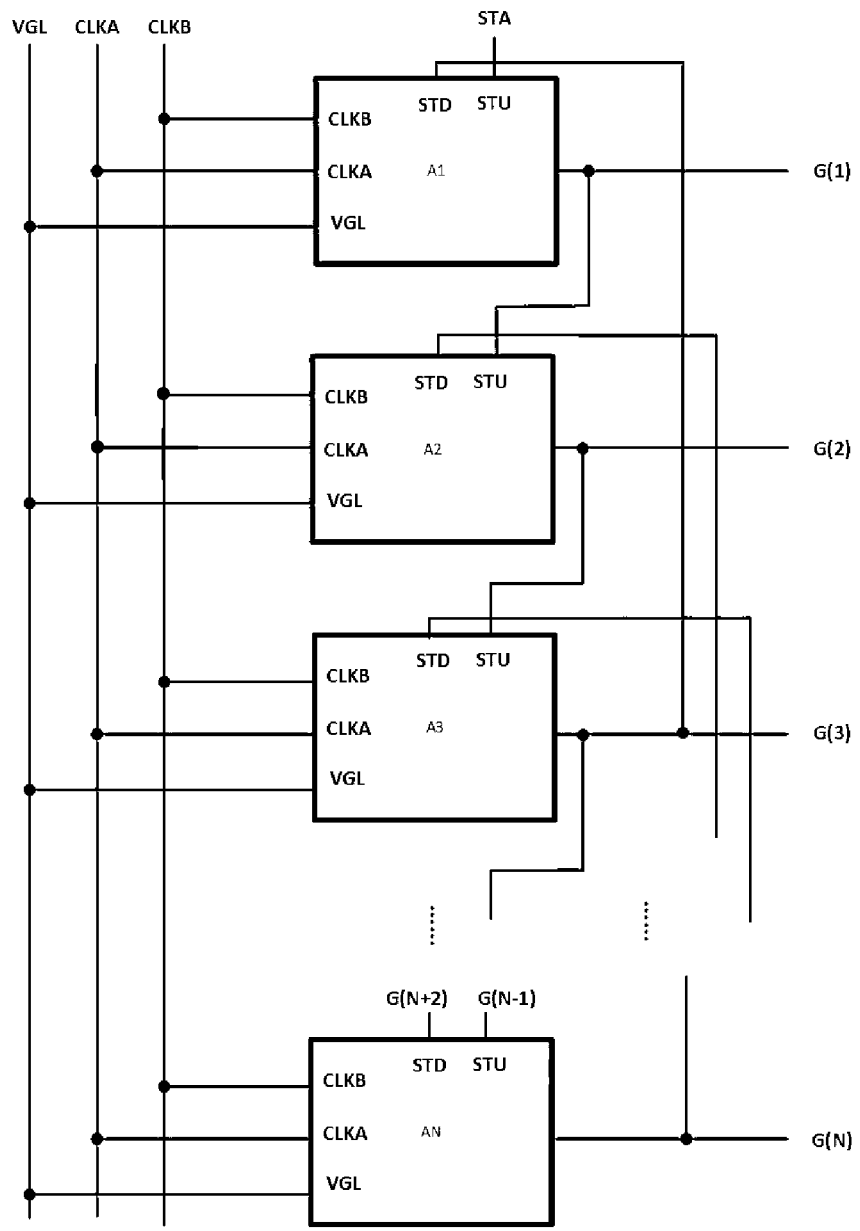
FIG. 6 is a block diagram of a structure of a gate driving circuit according to an embodiment of the present disclosure.

In another aspect, referring to FIG. 6, an embodiment of the present disclosure provides a gate driving circuit including a plurality of cascaded shift registers each being the shift register provided by the embodiments of the present disclosure. The signal output terminal of the N-th shift register is coupled to the first signal input terminal of the (N+1)-th shift register; and the second signal input terminal of the N-th shift register is coupled to the signal output terminal of the (N+2)-th shift register. In this case, the signal output from the signal output terminal Vout of the N-th shift register serves as the input signal to the first signal input terminal STU of the (N+1)-th shift register, and the signal output from the signal output terminal of the (N+2)-th shift register serves as the signal input to the second signal input terminal STD of the N-th shift register.

It should be noted that the signal output from the signal output terminal Vout of each shift register is used to drive a gate line G coupled to a display area of the display panel.

It should also be noted that the signal input to the first signal input terminal STU of the first shift register may be provided by the output terminal of a previous dummy shift register, and the signals input to the second signal input terminals STD of the last two shift registers may be provided by the output terminals of next two dummy shift registers, respectively. The dummy shift registers may have a similar structure to the shift register provided by the present disclosure, but is not used to drive a gate line.

The gate driving circuit of the embodiment includes a plurality of cascaded shift registers provided by the embodiments of the present disclosure. For detailed description, reference may be made to the foregoing description of the shift register, which is not repeatedly described herein.

The gate driving circuit of the embodiment includes the shift register provided by the embodiments of the present disclosure. The reset control sub-circuit 3 can control on and off states of the pull-up node reset sub-circuit 4 under the control of the reset signal input to the second signal input terminal STD, so the pull-up node reset sub-circuit 4 can be prevented from being turned on in the input phase, thereby avoiding noise at the second signal input terminal STD; at the same time, the shift register in the gate driving circuit of the embodiment is provided with only one DC signal, i.e., the DC low level signal VGL, which reduces the complexity of the circuit structure.

In another aspect, an embodiment of the present disclosure provides a display apparatus including the gate driving circuit provided by the embodiment of the present disclosure. The display apparatus may be any product or component having a display function such as a liquid crystal display panel, an electronic paper, a mobile phone, a tablet computer, a television, a display, a notebook computer, a digital photo frame, a navigator, or the like.

The display apparatus of the embodiment of the present disclosure includes the above-described gate driving circuit. The reset control sub-circuit 3 can control on and off states of the pull-up node reset sub-circuit 4 under the control of the reset signal input to the second signal input terminal STD, so the pull-up node reset sub-circuit 4 can be prevented from being turned on in the input phase, thereby avoiding noise at the second signal input terminal STD; at the same time, the shift register in the display apparatus provided in the embodiment of the present disclosure is provided with only one DC signal, i.e., the DC low level signal VGL, which reduces the complexity of the circuit structure.

Figure 7:
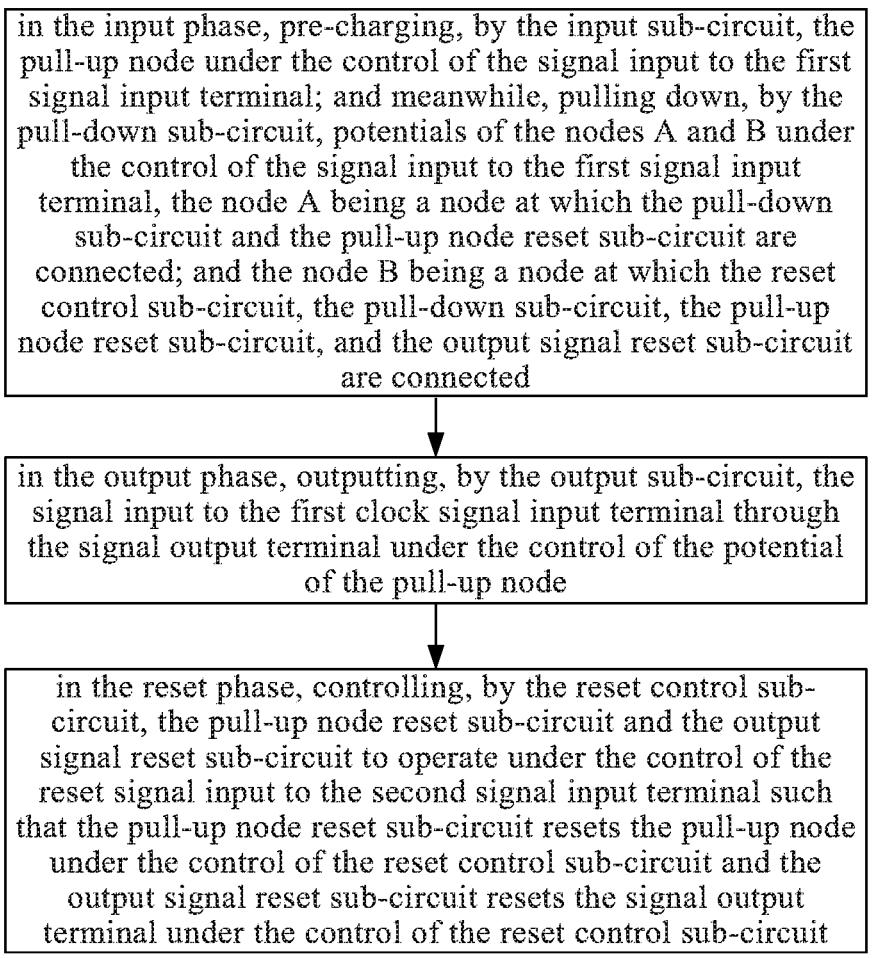
FIG. 7 is a flow chart illustrating a driving method of a gate driving circuit according to an embodiment of the present disclosure.

In another aspect, referring to FIG. 7, an embodiment of the present disclosure provides a driving method of a gate driving circuit, the gate driving circuit includes a plurality of cascaded shift registers each being the shift register provided by the embodiments of the present disclosure, and the driving method includes:

in the input phase, pre-charging, by the input sub-circuit, the pull-up node under the control of the signal input to the first signal input terminal; and in the meanwhile, pulling down, by the pull-down sub-circuit, potentials of the nodes A and B under the control of the signal input to the first signal input terminal, the node A being a node at which the pull-down sub-circuit and the pull-up node reset sub-circuit are connected; and the node B being a node at which the reset control sub-circuit, the pull-down sub-circuit, the pull-up node reset sub-circuit, and the output signal reset sub-circuit are connected;

in the output phase, outputting, by the output sub-circuit, the signal input to the first clock signal input terminal through the signal output terminal under the control of the potential of the pull-up node; and in the reset phase, controlling, by the reset control sub-circuit, the pull-up node reset sub-circuit and the output signal reset sub-circuit to operate under the control of the reset signal input to the second signal input terminal such that the pull-up node reset sub-circuit resets the pull-up node under the control of the reset control sub-circuit and the output signal reset sub-circuit resets the signal output terminal under the control of the reset control sub-circuit.

The driving method of a gate driving circuit of the embodiment is used to drive the gate driving circuit including a plurality of cascaded shift registers provided by the embodiments of the present disclosure, and for detailed description, reference may be made to the foregoing description of the shift registers, which is not repeatedly described herein.

The driving method of a gate driving circuit of the embodiment is used to drive the gate driving circuit including a plurality of cascaded shift registers provided by the embodiments of the present disclosure. The reset control sub-circuit 3 can control on and off states of the pull-up node reset sub-circuit 4 under the control of the reset signal input to the second signal input terminal STD, so the pull-up node reset sub-circuit 4 can be prevented from being turned on in the input phase, thereby avoiding noise at the second signal input terminal STD; at the same time, the shift register in the gate driving circuit of the embodiment is provided with only one DC signal, i.e., the DC low level signal VGL, which reduces the complexity of the circuit structure.

In a case where the shift register further includes a potential maintaining sub-circuit (e.g., the shift register is the shift register shown in FIG. 5), referring to FIG. 8, the driving method further includes:

in the output phase, preventing, by the potential maintaining sub-circuit, the pull-up node reset sub-circuit from generating a leakage current under the control of the signal input to the first clock signal input terminal; and in the reset phase, preventing, by the potential maintaining sub-circuit, the pull-up node reset sub-circuit from generating a leakage current under the control of the signal input to the second clock signal input terminal.

The driving method of a gate driving circuit of the embodiment is used to drive the gate driving circuit including a plurality of cascaded shift registers provided by the embodiments of the present disclosure, and for detailed description, reference may be made to the foregoing description of the shift registers, which is not repeatedly described herein.

The driving method of a gate driving circuit of the embodiment is used to drive the gate driving circuit including a plurality of cascaded shift registers provided by the embodiments of the present disclosure. The reset control sub-circuit 3 can control on and off states of the pull-up node reset sub-circuit 4 under the control of the reset signal input to the second signal input terminal STD, so the pull-up node reset sub-circuit 4 can be prevented from being turned on in the input phase, thereby avoiding noise at the second signal input terminal STD; at the same time, the shift register in the gate driving circuit of the embodiment is provided with only one DC signal, i.e., the DC low level signal VGL, which reduces the complexity of the circuit structure; in addition, the potential maintaining sub-circuit 7 can effectively prevent the pull-up node reset sub-circuit 4 from generating a leakage current.

It could be understood that the above implementations are merely exemplary implementations adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A shift register, comprising an input sub-circuit, an output sub-circuit, a reset control sub-circuit, a pull-up node reset sub-circuit, and an output signal reset sub-circuit; wherein
the input sub-circuit is coupled to a first signal input terminal, the pull-up node reset sub-circuit and a pull-up node, and is configured to pre-charge the pull-up node under control of a signal input to the first signal input terminal;
the output sub-circuit is coupled to a first clock signal input terminal, the pull-up node, the output signal reset sub-circuit and a signal output terminal, and is configured to output, through the signal output terminal, a signal input to the first clock signal input terminal under a control of a potential of the pull-up node;
the reset control sub-circuit is coupled to the pull-up node reset sub-circuit, the output signal reset sub-circuit and a second signal input terminal, and is configured to control on and off states of the pull-up node reset sub-circuit and the output signal reset sub-circuit under a control of a reset signal input to the second signal input terminal;
the pull-up node reset sub-circuit is further coupled to the pull-up node, the second signal input terminal and the output signal reset sub-circuit, and is configured to reset the pull-up node under a control of the reset control sub-circuit;
the output signal reset sub-circuit is further coupled to the output sub-circuit, the signal output terminal and a third signal input terminal, and is configured to reset the signal output terminal under the control of the reset control sub-circuit; and
the pull-up node is a node at which the input sub-circuit, the output sub-circuit, and the pull-up node reset sub-circuit are connected.

2. The shift register of claim 1, further comprising a pull-down sub-circuit coupled to the first signal input terminal, the third signal input terminal, the pull-up node reset sub-circuit, the reset control sub-circuit and the output signal reset sub-circuit and configured to pull down potentials of nodes A and B under the control of the signal input to the first signal input terminal;
wherein the node A is a node at which the pull-down sub-circuit and the pull-up node reset sub-circuit are connected; the node B is a node at which the reset control sub-circuit, the pull-down sub-circuit, the pull-up node reset sub-circuit, and the output signal reset sub-circuit are connected.

3. The shift register of claim 1, wherein the reset control sub-circuit comprises a third transistor, a first electrode of the third transistor is coupled to the second signal input terminal, a second electrode of the third transistor is coupled to the pull-up node reset sub-circuit and the output signal reset sub-circuit, and a control electrode of the third transistor is coupled to the second signal input terminal.

4. The shift register of claim 1, wherein the input sub-circuit comprises a first transistor;
a first electrode of the first transistor is coupled to the first signal input terminal, a second electrode of the first transistor is coupled to the pull-up node reset sub-circuit and the pull-up node, and a control electrode of the first transistor is coupled to the first signal input terminal.

5. The shift register of claim 1, wherein the output sub-circuit comprises a fifth transistor and a storage capacitor;
a first electrode of the fifth transistor is coupled to the first clock signal input terminal, a second electrode of the fifth transistor is coupled to a second terminal of the storage capacitor, the output signal reset sub-circuit and the signal output terminal, and a control electrode of the fifth transistor is coupled to the pull-up node and a first terminal of the storage capacitor.

6. The shift register of claim 1, wherein the pull-up node reset sub-circuit comprises a second transistor and a seventh transistor;
a first electrode of the second transistor is coupled to the input sub-circuit and the pull-up node, a second electrode of the second transistor is coupled to the third signal input terminal, and a control electrode of the second transistor is coupled to a first electrode of the seventh transistor; and
a second electrode of the seventh transistor is coupled to the second signal input terminal, and a control electrode of the seventh transistor is coupled to the reset control sub-circuit and the output signal reset sub-circuit.

7. The shift register of claim 1, wherein the output signal reset sub-circuit comprises an eighth transistor;
a first electrode of the eighth transistor is coupled to the output sub-circuit and the signal output terminal, a second electrode of the eighth transistor is coupled to the third signal input terminal, and a control electrode of the eighth transistor is coupled to the pull-up node reset sub-circuit and the reset control sub-circuit.

8. The shift register of claim 2, wherein the pull-down sub-circuit comprises a sixth transistor and a fourth transistor;
a first electrode of the sixth transistor is coupled to the pull-up node reset sub-circuit, a second electrode of the sixth transistor is coupled to the third signal input terminal, and a control electrode of the sixth transistor is coupled to the first signal input terminal; and
a first electrode of the fourth transistor is coupled to the pull-up node reset sub-circuit, the reset control sub-circuit and the output signal reset sub-circuit, a second electrode of the fourth transistor is coupled to the third signal input terminal, and a control electrode of the fourth transistor is coupled to the first signal input terminal.

9. The shift register of claim 1, further comprising a potential maintaining sub-circuit coupled to a second clock signal input terminal, the first signal input terminal, the input sub-circuit, the first clock signal input terminal and the pull-up node reset sub-circuit and configured to prevent the pull-up node reset sub-circuit from generating a leakage current under a control of signals input to the first clock signal input terminal and the second clock signal input terminal.

10. The shift register of claim 9, wherein the potential maintaining sub-circuit comprises a ninth transistor and a tenth transistor;
a first electrode of the ninth transistor is coupled to the first signal input terminal and the input sub-circuit, a second electrode of the ninth transistor is coupled to the input sub-circuit, the pull-up node reset sub-circuit and a first electrode of the tenth transistor, and a control electrode of the ninth transistor is coupled to the second clock signal input terminal; and
a second electrode of the tenth transistor is coupled to the first clock signal input terminal, the output sub-circuit and a control electrode of the tenth transistor, and the control electrode of the tenth transistor is further coupled to the first clock signal input terminal and the output sub-circuit.

11. The shift register of claim 9, wherein the input sub-circuit comprises a first transistor; a first electrode of the first transistor is coupled to the potential maintaining sub-circuit, a second electrode of the first transistor is coupled to the pull-up node and the pull-up node reset sub-circuit, and a control electrode of the first transistor is coupled to the first signal input terminal.

12. The shift register of claim 9, wherein the pull-up node reset sub-circuit comprises a second transistor and a seventh transistor;
a first electrode of the second transistor is coupled to the input sub-circuit and the pull-up node, a second electrode of the second transistor is coupled to the potential maintaining sub-circuit, and a control electrode of the second transistor is coupled to a first electrode of the seventh transistor; and
a second electrode of the seventh transistor is coupled to the second signal input terminal, and a control electrode of the seventh transistor is coupled to the reset control sub-circuit and the output signal reset sub-circuit.

13. A gate driving circuit, comprising a plurality of cascaded shift registers, each shift register comprising an input sub-circuit, an output sub-circuit, a reset control sub-circuit, a pull-up node reset sub-circuit, and an output signal reset sub-circuit, wherein
the input sub-circuit is coupled to a first signal input terminal, the pull-up node reset sub-circuit and a pull-up node, and is configured to pre-charge the pull-up node under control of a signal input to the first signal input terminal;
the output sub-circuit is coupled to a first clock signal input terminal, the pull-up node, the output signal reset sub-circuit and a signal output terminal, and is configured to output, through the signal output terminal, a signal input to the first clock signal input terminal under a control of a potential of the pull-up node;
the reset control sub-circuit is coupled to the pull-up node reset sub-circuit, the output signal reset sub-circuit and a second signal input terminal, and is configured to control on and off states of the pull-up node reset sub-circuit and the output signal reset sub-circuit under a control of a reset signal input to the second signal input terminal;
the pull-up node reset sub-circuit is further coupled to the pull-up node, the second signal input terminal and the output signal reset sub-circuit, and is configured to reset the pull-up node under a control of the reset control sub-circuit;
the output signal reset sub-circuit is further coupled to the output sub-circuit, the signal output terminal and a third signal input terminal, and is configured to reset the signal output terminal under the control of the reset control sub-circuit; and
the pull-up node is a node at which the input sub-circuit, the output sub-circuit, and the pull-up node reset sub-circuit are connected,
the signal output terminal of the N-th shift register is coupled to the first signal input terminal of the (N+1)-th shift register; and
the second signal input terminal of the N-th shift register is coupled to the signal output terminal of the (N+2)-th shift register.

14. A display apparatus, comprising the gate driving circuit of claim 13.

15. A driving method of a gate driving circuit, the gate driving circuit comprising a plurality of cascaded shift registers each being the shift register of claim 1, and the driving method comprising:
in an input phase, pre-charging, by the input sub-circuit, the pull-up node under the control of the signal input to the first signal input terminal;
in an output phase, outputting, by the output sub-circuit, the signal input to the first clock signal input terminal through the signal output terminal under the control of the potential of the pull-up node; and
in a reset phase, controlling, by the reset control sub-circuit, the pull-up node reset sub-circuit and the output signal reset sub-circuit to operate under the control of the reset signal input to the second signal input terminal such that the pull-up node reset sub-circuit resets the pull-up node under the control of the reset control sub-circuit and the output signal reset sub-circuit resets the signal output terminal under the control of the reset control sub-circuit.

16. The driving method of a gate driving circuit of claim 15, further comprising:
in the input phase, pulling down, by a pull-down sub-circuit, potentials of nodes A and B under the control of the signal input to the first signal input terminal;
wherein the node A is a node at which the pull-down sub-circuit and the pull-up node reset sub-circuit are connected; the node B is a node at which the reset control sub-circuit, the pull-down sub-circuit, the pull-up node reset sub-circuit and the output signal reset sub-circuit are connected.

17. The driving method of a gate driving circuit of claim 16, wherein the shift register comprised in the gate driving circuit further comprises: a potential maintaining sub-circuit coupled to a second clock signal input terminal, the first signal input terminal, the input sub-circuit, the first clock signal input terminal and the pull-up node reset sub-circuit and configured to prevent the pull-up node reset sub-circuit from generating a leakage current under a control of signals input to the first clock signal input terminal and the second clock signal input terminal, and the driving method further comprises:

in the output phase, preventing, by the potential maintaining sub-circuit, the pull-up node reset sub-circuit from generating a leakage current under the control of the signal input to the first clock signal input terminal; and in the reset phase, preventing, by the potential maintaining sub-circuit, the pull-up node reset sub-circuit from generating a leakage current under the control of the signal input to the second clock signal input terminal.

18. The driving method of a gate driving circuit of claim 15, comprising:

in the input phase, inputting a signal at a first level to the first signal input terminal such that the input sub-circuit pre-charges the pull-up node;

in the output phase, inputting a signal at a second level to the first signal input terminal and inputting a first clock signal to the first clock signal input terminal such that the output sub-circuit outputs, under the control of the potential of the pull-up node, the first clock signal input to the first clock signal input terminal through the signal output terminal, wherein the signal at the first level input to the first signal input terminal in the input phase and the signal at the second level input to the first signal input terminal in the output phase are logically opposite signals; and in the reset phase, inputting a reset signal to the second signal input terminal such that the reset control sub-circuit controls the pull-up node reset sub-circuit and the output signal reset sub-circuit to operate, so that the pull-up node reset sub-circuit resets the pull-up node under the control of the reset control sub-circuit and the output signal reset sub-circuit resets the signal output terminal under the control of the reset control sub-circuit.

19. The driving method of a gate driving circuit of claim 17, comprising:

in the input phase, inputting a signal at a first level to the first signal input terminal such that the input sub-circuit pre-charges the pull-up node;

in the output phase, inputting a signal at a second level to the first signal input terminal and inputting a first clock signal to the first clock signal input terminal such that the output sub-circuit outputs, under the control of the potential of the pull-up node, the first clock signal input to the first clock signal input terminal through the signal output terminal, and the potential maintaining sub-circuit prevents, under the control of the first clock signal input to the first clock signal input terminal, the pull-up node reset sub-circuit from generating a leakage current, wherein the signal at the first level input to the first signal input terminal in the input phase and the signal at the second level input to the first signal input terminal in the output phase are logically opposite signals; and in the reset phase, inputting a reset signal to the second signal input terminal and inputting a second clock signal to the second clock signal input terminal such that the reset control sub-circuit controls the pull-up node reset sub-circuit and the output signal reset sub-circuit to operate, so that the pull-up node reset sub-circuit resets the pull-up node under the control of the reset control sub-circuit, the output signal reset sub-circuit resets the signal output terminal under the control of the reset control sub-circuit, and the potential maintaining sub-circuit prevents the pull-up node reset sub-circuit from generating a leakage current under the control of the second clock signal input to the second clock signal input terminal.

20. The driving method of a gate driving circuit of claim 17, wherein the first clock signal input terminal and the second clock signal input terminal are applied with logically opposite clock signals.

* * * * *